US010804856B2

(12) United States Patent
Takenaka

(10) Patent No.: US 10,804,856 B2
(45) Date of Patent: *Oct. 13, 2020

(54) POWER AMPLIFIER

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/527,203

(22) Filed: Jul. 31, 2019

(65) Prior Publication Data

US 2019/0356276 A1 Nov. 21, 2019

Related U.S. Application Data

(63) Continuation of application No. 15/817,524, filed on Nov. 20, 2017, now Pat. No. 10,411,653.

(30) Foreign Application Priority Data

Nov. 24, 2016 (JP) .................................. 2016-227898

(51) Int. Cl.
*G06G 7/12* (2006.01)
*H03F 1/02* (2006.01)
(Continued)

(52) U.S. Cl.
CPC ............. *H03F 1/0288* (2013.01); *H03F 1/56* (2013.01); *H03F 1/565* (2013.01); *H03F 3/19* (2013.01);
(Continued)

(58) Field of Classification Search
CPC .......... H03F 1/0288; H03F 1/56; H03F 1/565; H03F 1/48; H03F 3/191; H03F 1/19;
(Continued)

(56) References Cited

U.S. PATENT DOCUMENTS

| 10,411,653 B2 * | 9/2019 | Takenaka .................. H03F 3/19 |
| 2008/0125061 A1 * | 5/2008 | Kuriyama ............. H03F 1/0205 455/127.1 |

(Continued)

FOREIGN PATENT DOCUMENTS

| JP | 2010135961 A | 6/2010 |
| JP | 2016-019228 A | 2/2016 |

(Continued)

OTHER PUBLICATIONS

IEEE Transactions on Microwave Theory and Techniques, vol. 49, No. 12, Dec. 2001, "An Extended Doherty Amplifier With High Efficiency Over a Wide Power Range", Masaya Iwamoto, Aracely Williams, Pin-Fan Chen, Andre G. Metzger, Lawrence E. Larson, Peter M. Asbeck, pp. 2472-2479.

*Primary Examiner* — Long Nguyen

(74) *Attorney, Agent, or Firm* — Pearne & Gordon LLP

(57) ABSTRACT

A power amplifier includes a distributor distributing an input first signal to a second signal and a third signal delayed by about $2\phi$ degrees ($45<\phi<90$) from the second signal, a first amplifier amplifying the second signal and outputting a fourth signal when a first-signal power level is not lower than a first level, a second amplifier amplifying the third signal and outputting a fifth signal when the first-signal power level is not lower than a second level that is greater than the first level, a first phase shifter receiving the fourth signal and outputting a sixth signal delayed by about $\phi$ degrees from the fourth signal, a second phase shifter receiving the fifth signal and outputting a seventh signal advanced by about $\phi$ degrees from the fifth signal, and a combiner combining the sixth and seventh signals and outputting an amplified signal of the first signal.

10 Claims, 7 Drawing Sheets

(51) Int. Cl.
  *H03F 1/56* (2006.01)
  *H03F 3/24* (2006.01)
  *H03F 3/19* (2006.01)
  *H03F 3/21* (2006.01)

(52) U.S. Cl.
  CPC .............. *H03F 3/21* (2013.01); *H03F 3/245* (2013.01); *H03F 2200/222* (2013.01); *H03F 2200/225* (2013.01); *H03F 2200/387* (2013.01); *H03F 2200/391* (2013.01); *H03F 2200/451* (2013.01)

(58) Field of Classification Search
  CPC ...... H03F 3/21; H03F 3/245; H03F 2200/222; H03F 2200/225; H03F 2200/387; H03F 2200/391; H03F 2200/451; H03G 1/0088; H03G 3/001; H03G 3/3036
  See application file for complete search history.

(56) References Cited

U.S. PATENT DOCUMENTS

| | | |
|---|---|---|
| 2009/0206926 A1 | 8/2009 | Horiguchi et al. |
| 2012/0235734 A1* | 9/2012 | Pengelly ............... H03F 1/0288 330/124 D |
| 2013/0194023 A1* | 8/2013 | Ahmed ................. H04L 7/0079 327/360 |
| 2016/0006399 A1 | 1/2016 | Blednov |
| 2016/0013761 A1 | 1/2016 | Takenaka |

FOREIGN PATENT DOCUMENTS

| | | |
|---|---|---|
| WO | 2007/015462 A1 | 2/2007 |
| WO | 2014/108716 A1 | 7/2014 |

* cited by examiner

POWER AMPLIFIER

This is a continuation of U.S. patent application Ser. No. 15/817,524 filed on Nov. 20, 2017 and issued as U.S. Pat. No. 10,411,653 on Sep. 10, 2019, which claims priority from Japanese Patent Application No. 2016-227898 filed on Nov. 24, 2016. The contents of these applications are incorporated herein by reference in their entireties.

BACKGROUND

The present disclosure relates to a power amplifier. A Doherty amplifier is known as a power amplifier with high efficiency. The Doherty amplifier is generally constituted by a carrier amplifier that operates regardless of a power level of an input signal, and by a peak amplifier that is turned off when the power level of the input signal is low, and that is turned on when the power level of the input signal is high, the carrier amplifier and the peak amplifier being connected in parallel. When the power level of the input signal is high, the carrier amplifier operates in a state of maintaining saturation at a saturation output power level. As a result, the Doherty amplifier is able to increase efficiency in comparison with an ordinary power amplifier.

Regarding a modified example of the Doherty amplifier, Masaya Iwamoto, Aracely Williams, Pin-Fan Chen, Andre G. Metzger, Lawrence E. Larson, Peter M. Asbeck, "An Extended Doherty Amplifier With High Efficiency Over a Wide Power Range" IEEE TRANSACTIONS ON MICROWAVE THEORY AND TECHNIQUES, VOL. 49, NO. 12, 2001, p. 2472-2479, for example, discloses a Doherty amplifier capable of providing a wider range of an output power level where efficiency is increased in comparison with that obtained by a general Doherty amplifier. Furthermore, Japanese Unexamined Patent Application Publication No. 2016-19228 discloses a Doherty amplifier constituted without using a $\lambda/4$ line that is used in the general Doherty amplifier.

According to the Doherty amplifier disclosed in the above-cited paper, when a combined saturation output level of the carrier amplifier and the peak amplifier is assumed to be a reference, a range up to reaching a point at which the carrier amplifier comes into a saturation state (i.e., a range where the carrier amplifier operates with high efficiency) (the range being also referred to as a "back-off" hereinafter) can be made relatively wide. However, because the relevant Doherty amplifier includes a $\lambda/4$ line, it is not adapted for a device, such as a cellular phone, for which downsizing is highly demanded. On the other hand, the Doherty amplifier disclosed in Japanese Unexamined Patent Application Publication No. 2016-19228 can reduce a circuit size because of not including the $\lambda/4$ line. However, the back-off of the relevant Doherty amplifier is relatively small. Accordingly, for a signal having a high PAPR (Peak to Average Power Ratio), for example, the carrier amplifier does not operate in a highly-efficient state, and there is a limitation in improving the efficiency.

BRIEF SUMMARY

In view of the situations described above, the present disclosure provides a power amplifier that is capable of operating over a wide range of an output power level with high efficiency, and realizing size reduction.

According to an embodiment of the present disclosure, a power amplifier includes a distributor that distributes a first signal input through an input terminal to a second signal and a third signal, the third signal being delayed by about $2\phi$ degrees ($\phi$ is a real number satisfying $45<\phi<90$) from the second signal, a first amplifier that amplifies the second signal and outputs a fourth signal when a power level of the first signal is in a region not lower than a first level, a second amplifier that amplifies the third signal and outputs a fifth signal when the power level of the first signal is in a region not lower than a second level that is greater than the first level, a first phase shifter to which the fourth signal is input, and which outputs a sixth signal delayed by about $\phi$ degrees from the fourth signal, a second phase shifter to which the fifth signal is input, and which outputs a seventh signal advanced by about $\phi$ degrees from the fifth signal, and a combiner that combines the sixth and seventh signals with each other, and that outputs an amplified signal of the first signal.

With the embodiment of the present disclosure, the power amplifier capable of operating over a wide range of the output power level with high efficiency and realizing size reduction is obtained.

Other features, elements, and characteristics of the present disclosure will become more apparent from the following detailed description of embodiments of the present disclosure with reference to the attached drawings.

BRIEF DESCRIPTION OF THE SEVERAL VIEWS OF THE DRAWINGS

FIG. 3 illustrates a state where the carrier amplifier and the peak amplifier are both turned on;

DETAILED DESCRIPTION

Embodiments of the present disclosure will be described in detail below with reference to the drawings. It is to be noted that the same elements are denoted by the same reference signs and duplicate description of the same elements is omitted.

Figure 1:
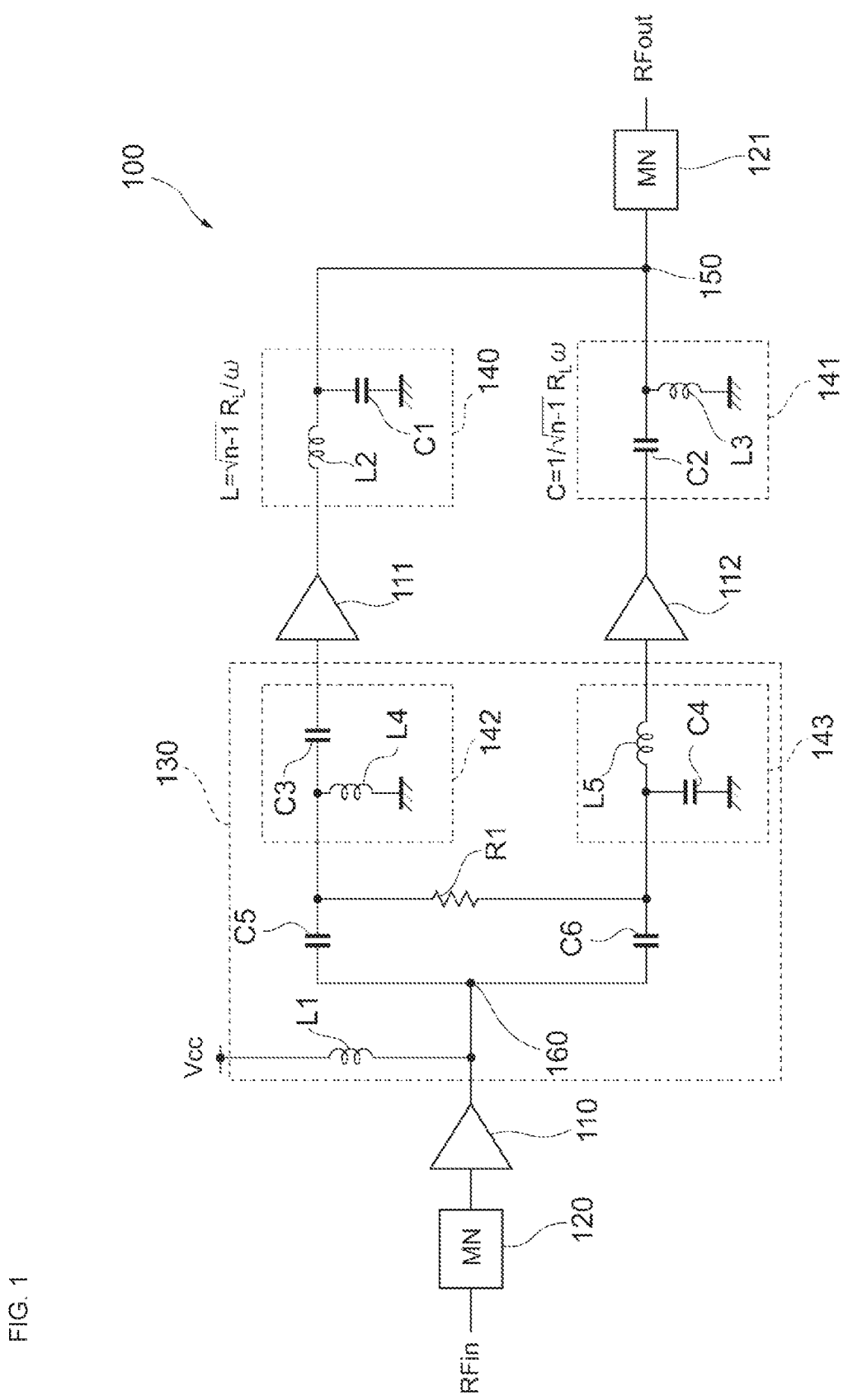
FIG. 1 illustrates an exemplary configuration of a power amplifier according to one embodiment of the present disclosure.

FIG. 1 illustrates an exemplary configuration of a power amplifier 100 according to one embodiment of the present disclosure. The power amplifier 100 is installed in a cellular phone, for example, and is used to amplify electrical power of a signal transmitted to a base station. The power amplifier 100 can amplify electrical powers of signals in accordance with communication standards, such as 2G (second generation communication system), 3G (third generation communication system), 4G (fourth generation communication system), 5G (fifth generation communication system), LTE (Long Term Evolution)-FDD (Frequency Division Duplex), LTE-TDD (Time Division Duplex), LTE-Advanced, and LTE-Advanced Pro. The communication standards for signals to be amplified by the power amplifier 100 are not limited to the above-mentioned examples.

The power amplifier 100 includes an initial-stage amplifier 110, a carrier amplifier 111, a peak amplifier 112, matching networks (MNs) 120 and 121, a distributor 130, phase shifters 140 and 141, and a combiner 150. Those individual components of the power amplifier 100 may be formed on a single substrate or on a plurality of substrates.

The initial-stage amplifier 110 (third amplifier) amplifiers an RF (Radio-Frequency) signal RFin (input signal) that is input through the matching circuit 120, and then outputs an amplified signal (first signal). The signal RFin has a frequency of about several GHz, for example. Though not being limited to particular one, the initial-stage amplifier 110 is constituted, for example, by a bipolar transistor such as an HBT (Heterojunction Bipolar Transistor), or by a transistor such as a MOSFET (Metal-Oxide-Semiconductor Field Effect Transistor). The above point is similarly applied to the carrier amplifier 111 and the peak amplifier 112 both described later.

The carrier amplifier 111, the peak amplifier 112, the distributor 130, the phase shifters 140 and 141, and the combiner 150 constitute a second-stage amplification circuit, which amplifies the signal (first signal) output from the initial-stage amplifier 110 and which has a configuration similar to that of a general Doherty amplifier.

The distributor 130 distributes the signal (first signal), which is output from the initial-stage amplifier 110, to a signal (second signal) applied to the carrier amplifier 111 and a signal (third signal) applied to the peak amplifier 112. More specifically, the distributor 130 includes an inductor L1, an input terminal 160, a capacitor C5 (third capacitor), a capacitor C6 (fourth capacitor), a resistance element R1, and phase shifters 142 and 143. The signal RFin input to the input terminal 160 is distributed to a path on the side including the carrier amplifier 111 and a path on the side including the peak amplifier 112 depending to a capacitance value ratio between the capacitors C5 and C6. The capacitors C5 and C6 may have substantially the same capacitance values or different capacitance values. When the capacitors C5 and C6 have substantially the same capacitance values, the signal RFin is distributed substantially evenly. Thus, the distributor 130 functions as a 3-dB distributor. The configuration of the distributor 130 is not limited to the above-mentioned example, and a distributed constant circuit, such as including coupling lines and a 3 dB coupler, may be used in another example.

The phase shifter 142 (third phase shifter) includes a capacitor C3 (fifth capacitor) connected in series between the capacitor C5 and the carrier amplifier 111, and an inductor L4 (third inductor) having one end that is electrically connected to a junction between the capacitor C3 and the capacitor C5, and the other end that is grounded. The phase shifter 142 outputs a signal (second signal) having a phase advanced by about φ degrees (φ is a real number satisfying 45<φ<90, this is similarly applied to φ in the following description) from that of the input signal RFin (first signal).

The phase shifter 143 (fourth phase shifter) includes an inductor L5 (fourth inductor) connected in series between the capacitor C6 and the peak amplifier 112, and a capacitor C4 (sixth capacitor) having one end that is electrically connected to a junction between the capacitor C6 and the inductor L5, and the other end that is grounded. The phase shifter 143 outputs a signal (third signal) having a phase delayed by about φ degrees from that of the input signal RFin (first signal).

With the presence of the phase shifters 142 and 143, the signal input to the peak amplifier 112 has a phase delayed by about 2φ degrees from that of the signal input to the carrier amplifier 111. Such a phase difference can be adjusted depending on design of respective constants of the capacitors C3 and C4 and the inductors L4 and L5.

The carrier amplifier 111 (first amplifier) amplifies the input signal (second signal) and outputs an amplified signal (fourth signal). The peak amplifier 112 (second amplifier) amplifies the input signal (third signal) and outputs an amplified signal (fifth signal). In this embodiment, the carrier amplifier 111 is biased so as to constitute an AB-class amplifier, and the peak amplifier 112 is biased so as to constitute a C-class amplifier.

Figure 2:
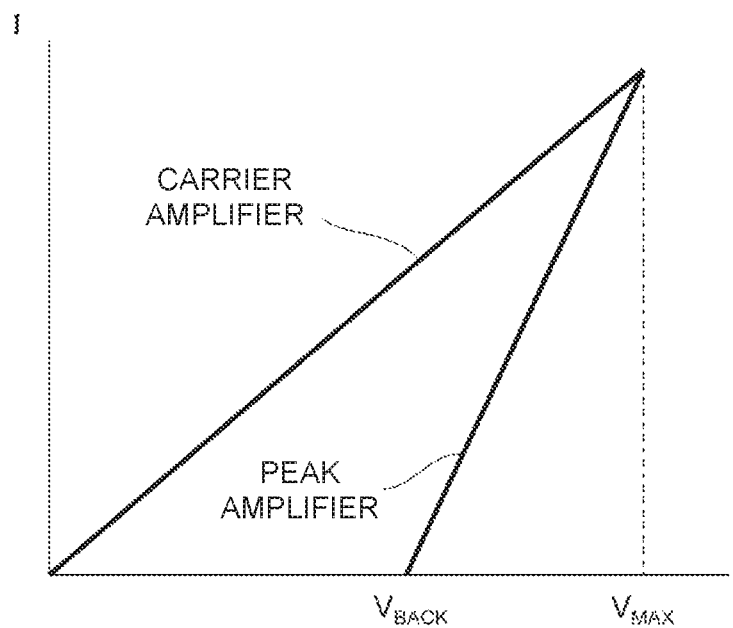
FIG. 2 is a graph depicting examples of respective operation characteristics of a carrier amplifier and a peak amplifier.

FIG. 2 is a graph depicting examples of respective operation characteristics of the carrier amplifier 111 and the peak amplifier 112. In FIG. 2, the horizontal axis represents a voltage of the signal RFin, and the vertical axis represents a current of each amplifier. As depicted in FIG. 2, the carrier amplifier 111 operates regardless of a voltage level of the signal RFin. Stated in another way, the carrier amplifier 111 operates regardless of a power level of the signal RFin (namely, in a region where the power level is not less than zero (first level)). On the other hand, the peak amplifier 112 operates in a region where the power level of the signal RFin is not less than a level $V_{BACK}$ (second level) (back-off point) that is lower than a maximum level $V_{MAX}$ by a predetermined level. Stated in another way, the peak amplifier 112 operates in a region where the power level of the signal RFin is not less than a level (second level) that is lower than the maximum level by a predetermined level (e.g., about 6 dB), and that is greater than zero (first level).

Returning to FIG. 1, the phase shifter 140 (first phase shifter) includes an inductor L2 (first inductor) connected in series between the carrier amplifier 111 and the combiner 150, and a capacitor C1 (second capacitor) having one end that is electrically connected to the combiner 150, and the other end that is grounded. In this embodiment, an inductance of the inductor L2 is set to $L=\{\sqrt{(n-1)}\}R_L/\omega$. Here, ω denotes an angular frequency corresponding to a center frequency of the signal RFin, $R_L$ denotes an impedance on the phase shifter side on condition that the carrier amplifier 111 and the peak amplifier 112 are both turned on, as described later, when looked from an output of each amplifier, and n denotes an impedance conversion ratio of each of the phase shifter 140 and the phase shifter 141 (n is a real number satisfying n>2). The phase shifter 140 outputs a signal (sixth signal) having a phase delayed by about φ degrees from that of the signal (fourth signal) output from the carrier amplifier 111.

The phase shifter 141 (second phase shifter) includes a capacitor C2 (first capacitor) connected in series between the peak amplifier 112 and the combiner 150, and an inductor L3 (second inductor) having one end that is electrically connected to the combiner 150, and the other end that is grounded. In this embodiment, a capacitance of the capacitor C2 is set to $C=\{1/\sqrt{(n-1)}\}R_L/\omega$. The phase shifter 141 outputs a signal (seventh signal) having a phase advanced by about φ degrees from that of the signal (fifth signal) output from the peak amplifier 112. Thus, signal phases having the difference of about 2φ degrees are made even after the signals have passed through the phase shifters 140 and 141.

The phase difference can be adjusted depending on design of respective constants of the capacitors C1 and C2 and the inductors L2 and L3.

The combiner 150 outputs a signal, which is resulted from combining the signal (sixth signal) output from the phase shifter 140 and the signal (seventh signal) output from the phase shifter 141 with each other, as an amplified signal RFout of the signal RFin through the matching circuit 121.

Figure 3:
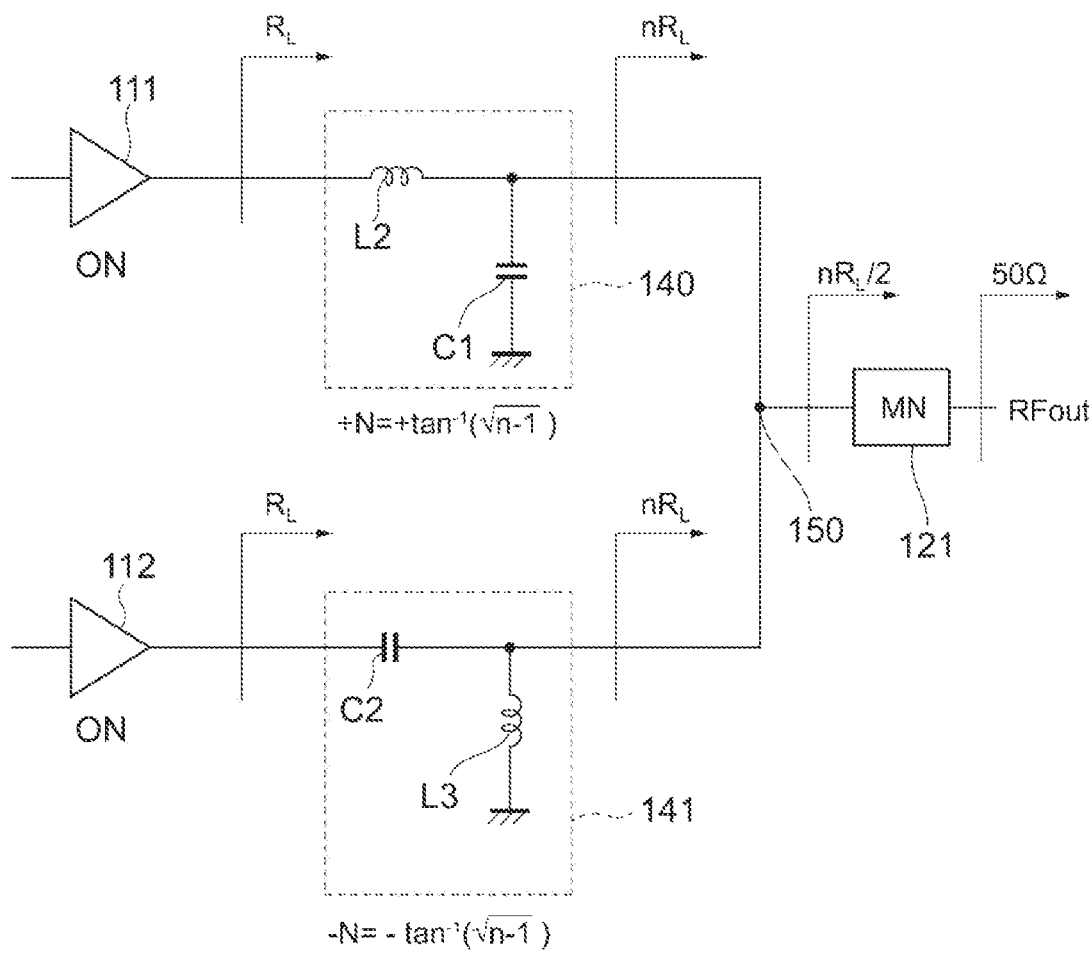

FIG. 3 illustrates a state (hereinafter referred to also as a "combined saturation output level") where the carrier amplifier 111 and the peak amplifier 112 are both turned on and currents flowing through both the amplifiers are equal, i.e., a state where the signal RFin is at $V_{MAX}$ In that case, the peak amplifier 112 is turned on, and a current flowing through the peak amplifier 112 is the same as that flowing through the carrier amplifier 111. Here, it is assumed that $R_L$ denotes the impedance on each of the side including the phase shifter 140 when looked from the output of the carrier amplifier 111 and the side including the phase shifter 141 when looked from the output of the peak amplifier 112. On condition that the impedance conversion ratio of each of the phase shifter 140 and the phase shifter 141 is n (n is a real number satisfying n>2), an impedance on the side including the combiner 150 when looked from the phase shifter 140 or the phase shifter 141 is $nR_L$. Moreover, because the phase shifter 140 and the phase shifter 141 are connected in parallel, an impedance on the load side (i.e., the side including the matching circuit 121) when looked from the combiner 150 is $nR_L/2$.

Thus, the phase shifter 140 not only delays the signal phase by about $\phi$ degrees, but also performs impedance conversion between the impedance ($R_L$) on the load side when looked from the output of the carrier amplifier 111 and the impedance ($nR_L$) on the load side when looked from the output of the phase shifter 140. The phase shifter 141 not only advances the signal phase by about $\phi$ degrees, but also performs impedance conversion between the impedance ($R_L$) on the load side when looked from the output of the peak amplifier 112 and the impedance ($nR_L$) on the load side when looked from the output of the phase shifter 141.

Figure 4:
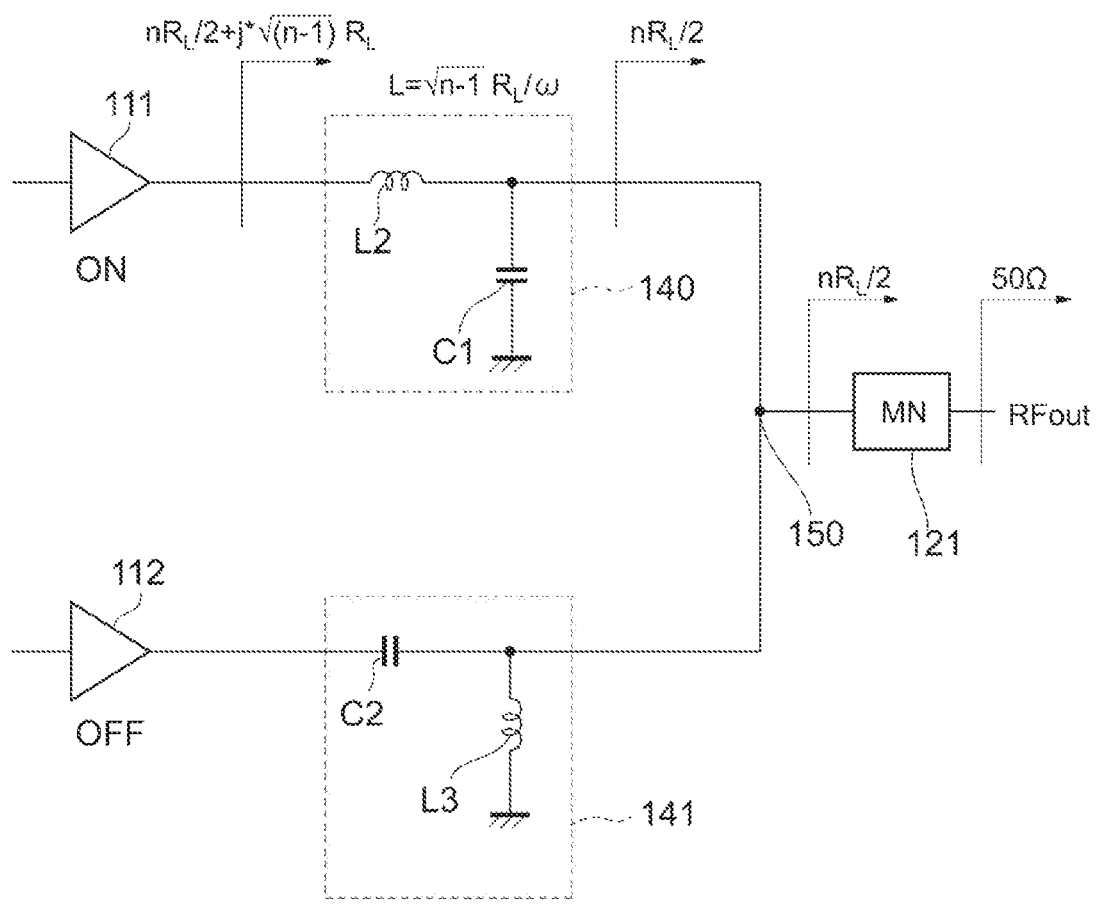
FIG. 4 illustrates a state where the carrier amplifier is turned on and the peak amplifier is turned off.

FIG. 4 illustrates a state where the carrier amplifier 111 is turned on and the peak amplifier 112 is turned off, i.e., a state where the signal RFin is in a region of not more than $V_{BACK}$. In that case, because the peak amplifier 112 is turned off, the impedance on the output side of the peak amplifier 112 is ideally open. Here, because the capacitor C1 and the inductor L3 resonate at the center frequency, they are negligible. Assuming that the impedance on the load side (i.e., the side including the matching circuit 121) when looked from the combiner 150 is $nR_L/2$, therefore, an impedance on the load side when looked from the inductor L2 is also $nR_L/2$. Accordingly, the impedance on the load side when looked from the output of the carrier amplifier 111 is $$nR_L/2 + j\omega \times \{\sqrt{(n-1)}\}R_L/\omega = nR_L/2 + j \times \{\sqrt{(n-1)}\}R_L.$$

With the power amplifier 100 having the above-described configuration, only the carrier amplifier 111 operates in a region where the power level of the signal RFin is comparatively low (i.e., a region where it is lower than the back-off point) Both the carrier amplifier 111 and the peak amplifier 112 operate in a region where the power level of the signal RFin is comparatively high (i.e., a region where it is not lower than the back-off point). Thus, since the power amplifier includes the carrier amplifier 111 that operates while maintaining the saturated state near the saturation output power, efficiency is improved in comparison with a configuration using only an A-class or AB-class amplifier even in a region resulted by subtracting the back-off from the combined saturation output level.

Figure 5:
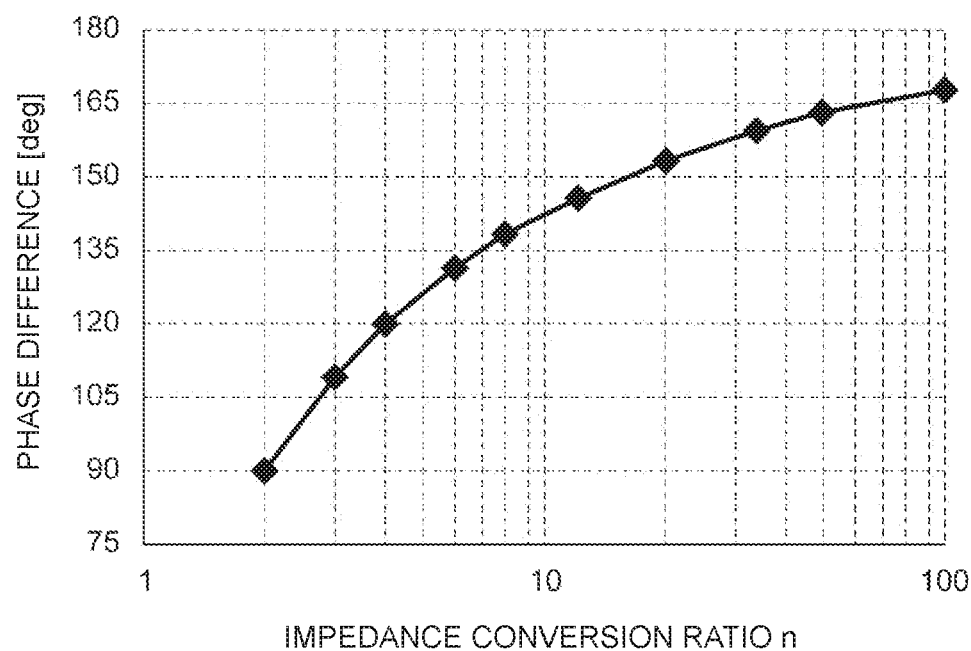
FIG. 5 is a graph depicting a relation between an impedance conversion ratio (n) of each phase shifter and a phase difference.

FIG. 5 is a graph depicting a relation between an impedance conversion ratio (n) of each of the phase shifters 140 and 141 and a phase difference. In the graph of FIG. 5, the horizontal axis represents the impedance conversion ratio (n) of each of the phase shifters 140 and 141, and the vertical axis represents a phase difference (deg) between the signal input to the carrier amplifier 111 and the signal input to the peak amplifier 112.

In this embodiment, a phase change (+$\phi$ degree) in the phase shifter 140 is expressed by $+\tan^{-1}\{\sqrt{(n-1)}\}$. A phase change (-$\phi$ degree) in the phase shifter 141 is expressed by $-\tan^{-1}\{\sqrt{(n-1)}\}$. Accordingly, the phase difference between the signal input to the carrier amplifier 111 and the signal input to the peak amplifier 112 is expressed by $2\Phi = 2 \times \tan^{-1}\{\sqrt{(n-1)}\}$. In theory, therefore, the phase difference 24 gradually approaches 180 degrees as n increases (see FIG. 5). It is to be noted that, because n is a real number satisfying n>2, $\phi$ satisfies a relation of 45<$\phi$<90.

Figure 6:
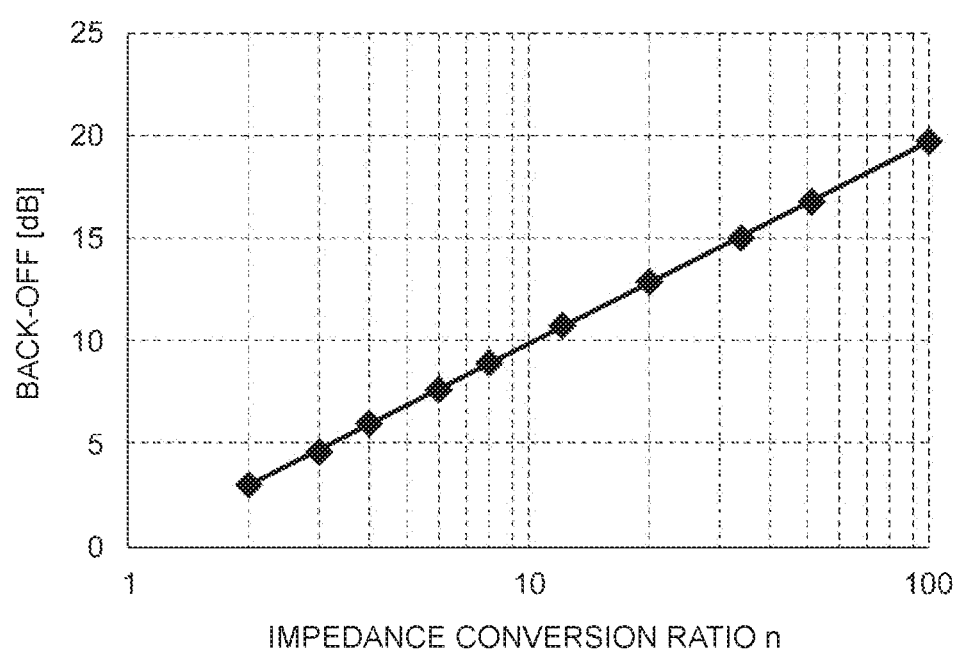
FIG. 6 is a graph depicting a relation between the impedance conversion ratio (n) of each phase shifter and a back-off.

FIG. 6 is a graph depicting a relation between the impedance conversion ratio (n) of each of the phase shifters 140 and 141 and a back-off. In the graph of FIG. 6, the horizontal axis represents the impedance conversion ratio (n) of each of the phase shifters 140 and 141, and the vertical axis represents a back-off (dB) of the power amplifier 100. Here, the back-off of the power amplifier 100 is expressed by $10 \log_{10}(n)$.

In the configuration disclosed in Japanese Unexamined Patent Application Publication No. 2016-19228 (hereinafter referred to also as a "comparative example"), the phase difference is 90 degrees, and this corresponds to the case where the impedance conversion ratio (n) in this specification is set to n=2. Accordingly, the back-off in the comparative example is given by $10 \log_{10}(2) = 3$ dB. On the other hand, in this embodiment, n is a real number satisfying n>2 as described above. Thus, the back-off in this embodiment is larger than 3 dB. Furthermore, in theory, the back-off increases with an increase of n (see FIG. 6).

As described above, the power amplifier 100 can provide a wider range of back-off than that obtained with the comparative example. In other words, higher efficiency can be achieved over a wider range of output power level. It is hence possible to improve efficiency even for, e.g., a signal having a low output power level and a signal having a high PAPR.

Assuming that an impedance on the output side when looked from the matching circuit 121 is about 50Ω as illustrated in FIGS. 3 and 4, n can be a value satisfying $nR_L/2 < 50$. Moreover, assuming $R_L$ to be about 2Ω at a minimum, n can be a value satisfying n<50. In practice, therefore, an upper limit of the phase difference is about 163 degrees, and an upper limit of the back-off is about 17 dB.

Figure 7:
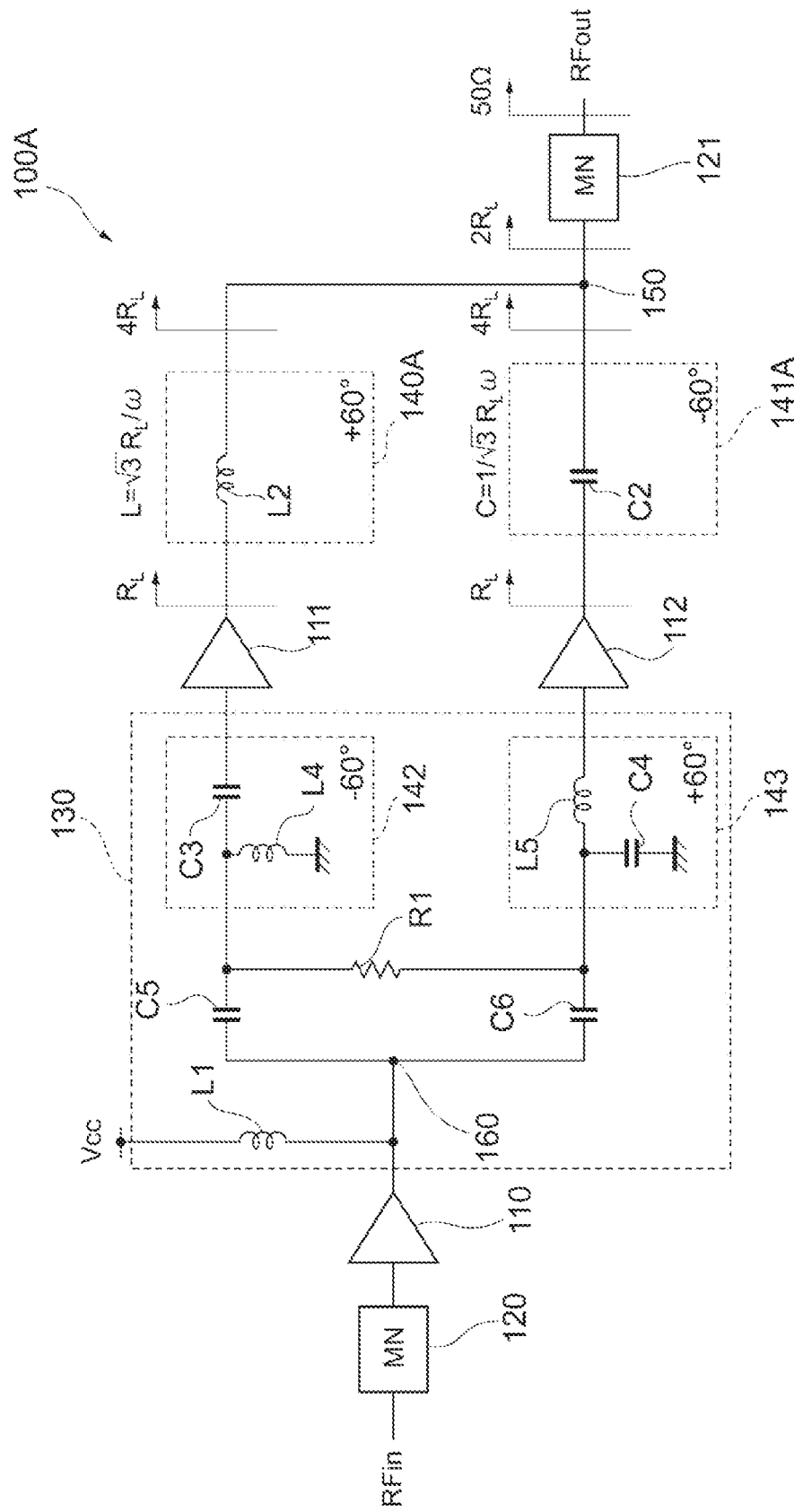
FIG. 7 illustrates an exemplary configuration of a power amplifier according to another embodiment of the present disclosure.

FIG. 7 illustrates an exemplary configuration of a power amplifier 100A according to another embodiment of the present disclosure. It is to be noted that the same components as those of the power amplifier 100 illustrated in FIG. 1 are denoted by the same reference signs and description of those components is omitted. The power amplifier 100A represents the exemplary configuration in which the impedance conversion ratio (n) in the power amplifier 100 is set to n=4. The power amplifier 100A includes phase shifters 140A and 141A instead of the phase shifters 140 and 141 illustrated in FIG. 1, respectively. FIG. 7 illustrates a state where the carrier amplifier 111 and the peak amplifier 112 are both turned on and currents flowing through both the amplifiers are equal, i.e., a state where the signal RFin is at $V_{MAX}$.

The phase shifter 140A has a configuration not including the capacitor C1 in comparison with the phase shifter 140. The phase shifter 141A has a configuration not including the inductor L3 in comparison with the phase shifter 141. Thus, the capacitor C1 in the phase shifter 140 and the inductor L3 in the phase shifter 141 may be omitted.

A phase difference in the power amplifier 100A is $2\Phi=2\times\tan^{-1}\{\sqrt{(4-1)}\}=120$ degrees. More specifically, the signal on the side including the carrier amplifier 111 is advanced in its phase by 60 degrees through the distributor 130, and after being amplified by the carrier amplifier 111, it is output with the phase delayed by 60 degrees through the phase shifter 140A. On the other hand, the signal on the side including the peak amplifier 112 is delayed in its phase by 60 degrees through the distributor 130, and after being amplified by the peak amplifier 112, it is output with the phase advanced by 60 degrees through the phase shifter 141A. The back-off in the power amplifier 100A is given by $10 \log_{10}(4)=6$ dB.

The power amplifier 100A having the above-described configuration can also provide similar effects to those obtained with the power amplifier 100. It is to be noted that the value of the impedance conversion ratio (n) is not limited to n=4 and the value may be a real number satisfying n>2.

Figure 8:
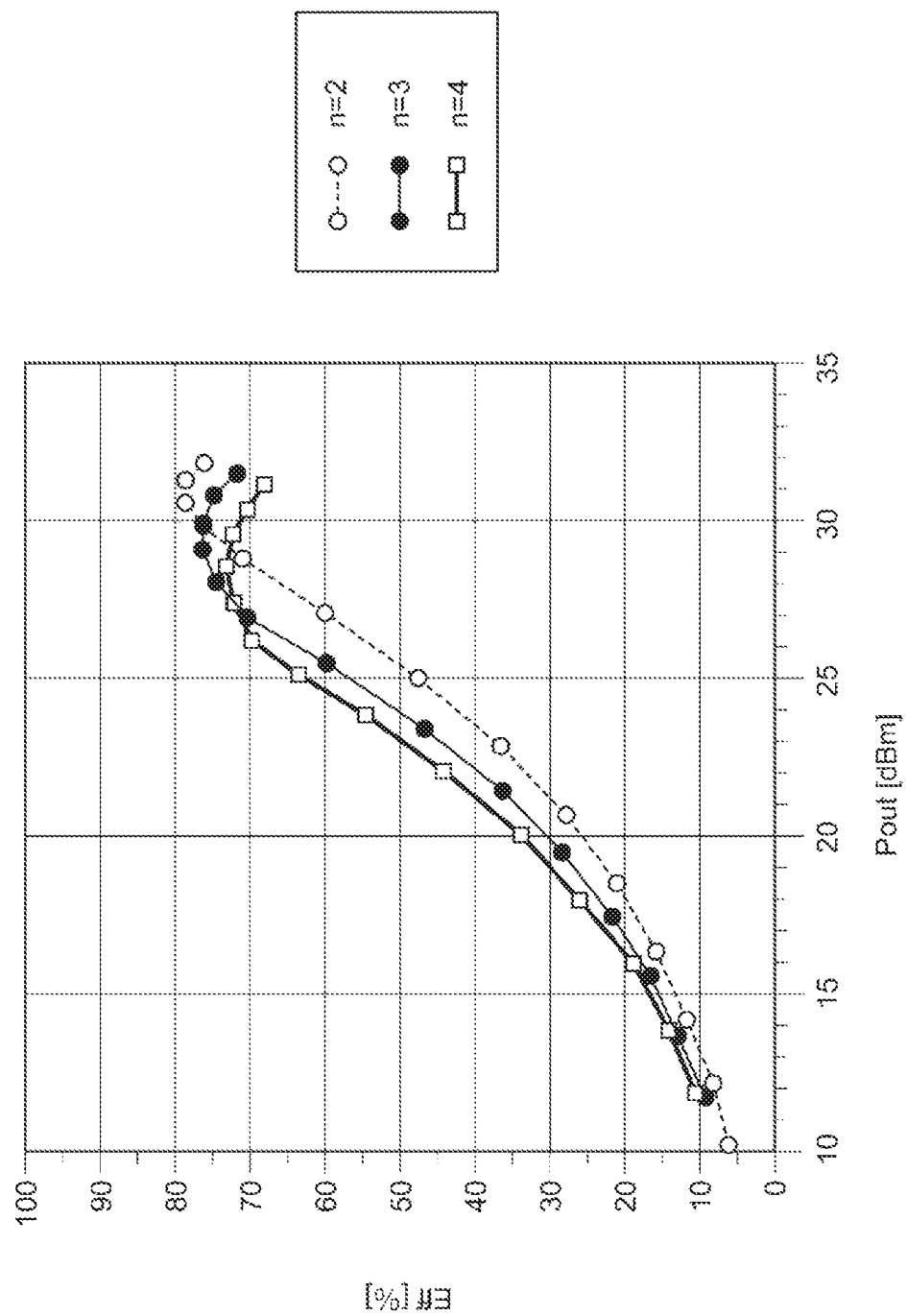
FIG. 8 is a graph depicting an example of simulation results of power addition efficiency in the power amplifier according to the one embodiment and a comparative example.

FIG. 8 is a graph depicting an example of simulation results of power addition efficiency in the power amplifier 100 and the comparative example. In the graph of FIG. 8, the horizontal axis represents output power (Pout: dBm), and the vertical axis represents power addition efficiency (Eff: %). FIG. 8 depicts the simulation results when the impedance conversion ratio (n) is set to n=2 (comparative example), 3 and 4 in the power amplifier 100.

As seen from FIG. 8, an efficiency peak point changes toward a lower level of the output power with an increase of n than in the comparative example. Furthermore, in a range where the output power does not exceed about 29 dBm, the power addition efficiency at the same output level is improved to a higher level in the case of n=3 or n=4 than in the comparative example. Those simulation results also show that the power amplifier 100 can provide a wider range of back-off with an increase of n.

The exemplary embodiments of the present disclosure have been described above. The power amplifier 100 or 100A includes the distributor 130 that distributes a signal, the carrier amplifier 111, the peak amplifier 112 to which is input a signal having a phase delayed by about $2\phi$ degrees ($45<\phi<90$) from that of a signal input to the carrier amplifier 111, the phase shifter 140 or 140A that delays the phase by about $\phi$ degrees, and the phase shifter 141 or 141A that advances the phase by about $\phi$ degrees. With such a configuration, each of the power amplifiers 100 and 100A can provide a wider range of back-off than that obtained with the comparative example. Thus, higher efficiency can be achieved over a wider range of output power level. It is hence possible to improve efficiency even for a signal having a low output power level and a signal having a high PAPR.

Furthermore, the phase shifter 140 includes the inductor L2 connected in series between the carrier amplifier 111 and the combiner 150, and the phase shifter 141 includes the capacitor C2 connected in series between the peak amplifier 112 and the combiner 150. The phase difference ($\phi$ degrees) between the signals can be adjusted depending on design of respective constants of the inductor L2 and the capacitor C2.

Although the configurations of the phase shifters 140 and 141 are not limited to particular ones, the phase shifter 140 may include, for example, the capacitor C1 having one end electrically connected to the combiner 150 and the other end grounded, and the phase shifter 141 may include, for example, the inductor L3 having one end electrically connected to the combiner 150 and the other end grounded. Alternatively, as illustrated in FIG. 7, the capacitor C1 and the inductor L3 may be omitted.

In each of the power amplifiers 100 and 100A, the distributor 130 includes the phase shifter 142 that advances the phase by about $\phi$ degrees, and the phase shifter 143 that delays the phase by about $\phi$ degrees. As a result, the phase shifters 142 and 143 can output signals having phases shifted by about $2\phi$ degrees away from each other.

In each of the power amplifiers 100 and 100A, the distributor 130 includes the capacitors C5 and C6 having one ends connected to the input terminal 160 and the other ends connected respectively to the phase shifters 142 and 143. The phase shifter 142 includes the capacitor C3 connected in series between the capacitor C5 and the carrier amplifier 111, and the inductor L4 having one end that is electrically connected to the junction between the capacitor C3 and the capacitor C5, and the other end that is grounded. The phase shifter 143 includes the inductor L5 connected in series between the capacitor C6 and the peak amplifier 112, and the capacitor C4 having one end that is electrically connected to the junction between the inductor L5 and the capacitor C6, and the other end that is grounded. The phase difference ($\phi$ degrees) between the signals can be adjusted depending on design of respective constants of the capacitors C3 and C4 and the inductors L4 and L5.

Each of the power amplifiers 100 and 100A includes the initial-stage amplifier 110 prior to the distributor 130, and has a configuration of a two-stage amplifier. The number of stages of amplifiers is not limited to two, and it may be one or three or more.

In each of the power amplifiers 100 and 100A, the distributor 130, the carrier amplifier 111, the peak amplifier 112, the phase shifters 140 and 141, and the combiner 150 may be formed on a single substrate.

The embodiments described above are intended to make easier understanding of the present invention, and are not intended to limit the scope of the present invention. The present invention can be modified and/or improved without departing from the gist of the invention, and equivalents of the matters disclosed herein are also included in the present invention. In other words, modifications resulted from changing design of the above-described embodiments as appropriate by those skilled in the art are also included in the scope of the present invention insofar as those modifications have the features of the present invention. By way of example, not only individual elements in the embodiments, but also layouts, materials, conditions, shapes, sizes, and so on of those elements are not limited to the illustrated ones, and they may be modified as appropriate. As a matter of course, the above-described embodiments are just illustrative, and individual components and configurations disclosed in the different embodiments can be partly replaced or combined with each other. Modifications resulted from the replacement or the combination are further included in the scope of the present invention insofar as those modifications have the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier comprising:
   a distributor comprising an input terminal through which a first signal is provided, and being configured to output a second signal and a third signal, wherein the third signal is delayed by 2φ degrees from the second signal and φ is a real number greater than 45 and less than 90;
   a first amplifier that amplifies the second signal and outputs a fourth signal when a power level of the first signal is less than a first level;
   a second amplifier that amplifies the third signal and outputs a fifth signal when the power level of the first signal is less than a second level, the second level being greater than the first level;
   a first phase shifter to which the fourth signal is input, and which outputs a sixth signal delayed by φ degrees from the fourth signal;
   a second phase shifter to which the fifth signal is input, and which outputs a seventh signal advanced by φ degrees from the fifth signal; and
   a combiner configured to combine the sixth signal and the seventh signal, and to output an amplified signal of the first signal, wherein:
   the first phase shifter comprises a first inductor connected in series between the first amplifier and the combiner,
   the second phase shifter comprises a first capacitor connected in series between the second amplifier and the combiner, and
   a capacitance of the first capacitor is equal to $1/(\sqrt{n-1}R_L/\omega)$, where n is an impedance conversion ratio of the first phase shifter, $R_L$ is an impedance as seen from an output of the first amplifier when the first and second amplifiers are turned on, and ω is an angular frequency corresponding to a center frequency of the first signal.

2. The power amplifier according to claim 1, wherein:
   the first phase shifter further comprises a second capacitor having one end electrically connected to the combiner and the other end grounded, and
   the second phase shifter further comprises a second inductor having one end electrically connected to the combiner and the other end grounded.

3. The power amplifier according to claim 1, wherein the distributor comprises:
   a third phase shifter to which the first signal is input, and which outputs the second signal advanced by φ degrees from the first signal; and
   a fourth phase shifter to which the first signal is input, and which outputs the third signal delayed by φ degrees from the first signal.

4. The power amplifier according to claim 2, wherein the distributor comprises:
   a third phase shifter to which the first signal is input, and which outputs the second signal advanced by φ degrees from the first signal; and
   a fourth phase shifter to which the first signal is input, and which outputs the third signal delayed by φ degrees from the first signal.

5. The power amplifier according to claim 3, wherein the distributor comprises:
   a third capacitor connected in series between the input terminal and the third phase shifter; and
   a fourth capacitor connected in series between the input terminal and the fourth phase shifter,
   wherein the third phase shifter comprises a fifth capacitor connected in series between the third capacitor and the first amplifier, and a third inductor having one end that is electrically connected to one end of the fifth capacitor and the other end that is grounded, and
   wherein the fourth phase shifter comprises a fourth inductor connected in series between the fourth capacitor and the second amplifier, and a sixth capacitor having one end that is electrically connected to one end of the fourth inductor and the other end that is grounded.

6. The power amplifier according to claim 4, wherein the distributor includes:
   a third capacitor connected in series between the input terminal and the third phase shifter; and
   a fourth capacitor connected in series between the input terminal and the fourth phase shifter,
   wherein the third phase shifter comprises a fifth capacitor connected in series between the third capacitor and the first amplifier, and a third inductor having one end that is electrically connected to one end of the fifth capacitor, and the other end that is grounded, and
   wherein the fourth phase shifter comprises a fourth inductor connected in series between the fourth capacitor and the second amplifier, and a sixth capacitor having one end that is electrically connected to one end of the fourth inductor, and the other end that is grounded.

7. The power amplifier according to claim 1, wherein the power amplifier further comprises a third amplifier that amplifies an input signal, and that outputs the first signal.

8. The power amplifier according to claim 1, wherein the distributor, the first amplifier, the second amplifier, the first phase shifter, the second phase shifter, and the combiner are located on a single substrate.

9. The power amplifier according to claim 1, wherein the first amplifier is an A-class or AB-class amplifier.

10. The power amplifier according to claim 1, wherein the second amplifier is a C-class amplifier.

* * * * *

UNITED STATES PATENT AND TRADEMARK OFFICE
CERTIFICATE OF CORRECTION

| | |
|---|---|
| PATENT NO. | : 10,804,856 B2 |
| APPLICATION NO. | : 16/527203 |
| DATED | : October 13, 2020 |
| INVENTOR(S) | : Kiichiro Takenaka |

Page 1 of 1

It is certified that error appears in the above-identified patent and that said Letters Patent is hereby corrected as shown below:

In the Claims

Column 9, Line 33, Claim 1, "and co is" should be -- and ω is --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*